United States Patent [19]

Kreider et al.

[11] Patent Number: 4,969,956
[45] Date of Patent: Nov. 13, 1990

[54] TRANSPARENT THIN FILM THERMOCOUPLE

[75] Inventors: Kenneth G. Kreider, Potomac, Md.; Moshe Yust, Haifa, Israel

[73] Assignee: The United States of America as represented by the Secretary of Commerce, Washington, D.C.

[21] Appl. No.: 452,439

[22] Filed: Dec. 19, 1989

[51] Int. Cl.⁵ ................. H01L 35/28; H01L 35/34
[52] U.S. Cl. ..................... 136/201; 136/205; 136/225; 136/236.1; 136/239
[58] Field of Search ........... 136/200, 201, 205, 225, 136/232, 236.1, 239

[56] References Cited

U.S. PATENT DOCUMENTS

| | | | |
|---|---|---|---|
| 3,006,978 | 10/1961 | McGrath et al. | 136/04 |
| 3,758,346 | 9/1973 | Falkenberg et al. | 136/202 |
| 4,010,291 | 3/1977 | Katsube et al. | 427/126 |
| 4,036,665 | 7/1977 | Barr | 136/202 |
| 4,399,015 | 8/1983 | Endo et al. | 204/192 |
| 4,450,316 | 5/1984 | Hamakawa et al. | 136/256 |
| 4,631,350 | 12/1986 | Germanton et al. | 136/225 |
| 4,650,557 | 3/1987 | Bitter | 204/192.12 |
| 4,665,276 | 5/1987 | Elbel et al. | 136/215 |
| 4,747,674 | 5/1988 | Butterfield et al. | 350/399 |
| 4,779,994 | 10/1988 | Diller et al. | 374/29 |
| 4,838,656 | 6/1989 | Stoddard | 350/336 |

Primary Examiner—Peter A. Nelson
Assistant Examiner—Chrisman Carroll
Attorney, Agent, or Firm—Thomas Zack; Alvin J. Englert; Frank A. Lukasik

[57] ABSTRACT

A transparent thin film thermocouple and a method of manufacturing comprising a positive element of indium tin oxide (ITO) and a negative element of indium oxide ($In_2O_3$) formed on a surface by reactive sputtering with the elements being electrically joined to form a hot junction for conversion of heat into electricity.

6 Claims, 3 Drawing Sheets

TRANSPARENT THIN FILM THERMOCOUPLE

BACKGROUND OF THE INVENTION

1. Field of the invention

This invention relates to thermoelectric elements which are efficient at relatively high temperatures for the measurement of temperature and, more particularly is concerned with semiconductor materials useful for such elements.

2. Background of the prior art

Thermocouples have been used for many years as accurate temperature measurement sensors. In fact, the International Practical Temperature Scale IPTS-68 is based on the type S platinum plus 10% platinum-rhodium reference grade thermocouple for temperatures above 950K. With the development of thin film techniques it was recognized that there are several advantages of thin film thermocouples over the standard wire thermocouples for measuring solid surface temperatures. Their low mass leads to very rapid response, the thinness of the film ($-2$ $\mu$m) does not disturb the convective heat transfer characteristics of the surface compared to the wire sensor, and the small size is quite compatible with complex electronic fabrication techniques. These advantages have led to development of numerous thin film thermocouple applications based on standard thermocouple alloys including temperature sensors for interior hardware in gas turbine and internal combustion engines.

Previous work by Bates et al, Am. Cer. Bull., 65(4), 1986, 673, had indicated a strong negative Seebeck coefficient in bulk $In_2O_3$-$SnO_2$. The Seebeck effect, which causes an electrical current flow when the junctions of dissimilar materials forming a thermocouple loop are subjected to different temperatures has long been known and has been utilized, as in thermocouples, for measuring temperatures. More recently, devices utilizing two unlike semiconductor materials in a thermocouple loop have been found to have low, but, for some purposes, useful efficiencies in the generation of electrical power from heat applied to one junction of the materials. However, such devices have shown marked decreases in efficiency as the temperature of the heated junction was raised and no material capable of providing a reasonably efficient thermoelectric device for operation at temperatures in excess of about 1,000° K. has previously been known.

The intent of this invention is to provide a practical thin film thermocouple using reactively sputtered thin film. Thin film thermocouples for high temperature measurement can be found in U.S. Pat. No. 3,006,978 to McGrath et al which discloses thin film thermocouple conductors which permit the use of brittle thermocouple materials capable of withstanding the effects of 5000° F. temperatures. Further disclosures may be found in U.S. Pat. No. 3,758,346 to Falkenberg et al, a thermoelectric generator; U.S. Pat. No. 4,665,276 to Ebel et al, a thermoelectric sensor; and U.S. Pat. No. 4,779,994 to Diller et al, a heat flux gage. None of the above patents disclose the transparent electrical conductor indium-tin-oxide (ITO) or any transparent material. ITO is an oxide containing 5-15 percent by weight tin in the indium oxide with the most useful compositions containing an In:Sn ratio of 9:1.

Other prior art devices may be found in U.S. Pat. No. 4,010,291 to Katsube et al; U.S. Pat. No. 4,399,015 to Endo et al; and U.S. Pat. No. 4,450,316 to Hamakawa et al. Although the prior art devices disclose indium-tin-oxide as a transparent electrode or a two-layer ($SnO_2$ and ITO) transparent electrode, there is no mention of the thermoelectric effect of ITO or $SnO_2$.

SUMMARY OF THE INVENTION

The prior art patents which are included above, trace the developments of thin film thermocouples and of ITO as a transparent electrode. The instant invention combines the two technologies in the form of a new sensor capable of measurement of temperature on mirrors and lenses without disturbing the optical properties.

It is an object of this invention to manufacture these novel thermoelectric elements and devices by an improved process in order to control the properties thereof.

It is another object of this invention to provide a method for producing said thermoelectric device in a form which will provide for the conversion of heat into electricity in order to measure the temperature of transparent materials without disturbing their optical properties.

A still further object of this invention is to produce a transparent thin film thermocouple by reactive sputtering wherein the positive leg of the thermocouple is indium tin oxide (ITO) with the In Sn ratio of 9:1, and the negative leg is indium oxide ($In_2O_3$).

These and other objects of the invention will become apparent to those skilled in the art to which the invention pertains when taken in light of the annexed drawings.

DESCRIPTION OF THE PREFERRED EMBODIMENT

Figure 1:
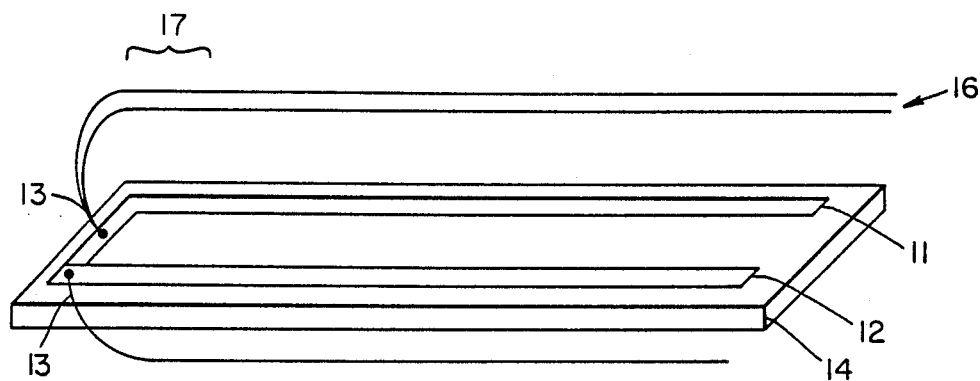
FIG. 1 is a perspective view of a thin film thermocouple calibration test specimen.

Referring now in more detail to the drawings, FIG. 1 shows a thin film thermocouple calibration test specimen. Thin films of indium oxide 11, indium tin oxide (ITO) 12 and platinum (not shown) were sputtered on alumina circuitboard test bar 14 ($11 \times 1 \times 0.06$ cm). The sputtering was accomplished with a 5 cm diameter magnetron source (not shown) in 99.999% purity argon at 0.4 Pa (3 mTorr) with metal targets (the ITO target had 10% tin in the indium). Reactive formation of the oxides was accomplished by replacing 10-40% of the argon with high purity (99.999%) oxygen. The increase of oxygen content in the sputtering atmosphere increases the film resistivity. ITO and $In_2O_3$ films were formed with a substrate temperature of 550-600 K at a distance of 10 cm and a power level of 200 watts. The platinum films were formed at 400 watts, with 10 cm between the target and substrate at 500 K substrate temperature. The test bars included complete 2 mm wide thermocouples of ITO vs In$_2$O$_3$, ITO vs PtRh vs Pt. Adhesion of all oxide and metal films was excellent on the Al$_2$O$_3$ substrates during thermal cycling to 1175 K using standard procedures. Platinum reference wires 13 (75 μm in diameter) were welded to the hot junction 17 of the platinum thin films 11 and 12 as shown in FIG. 1.

The thermoelectric response was tested in a specially designed furnace (not shown) that features a controlled hot zone (±3 mm hot junction location is equivalent to ±3 K); a steep transition region; and a water cooled attachment for the thin film thermocouple extension wires. It is critical to have the full thermal gradient in the thin film in order to measure its thermoelectric properties. All calibration testing was performed using a reference grade type S thermocouple 16 at the hot junction 17 of the thin film thermocouple and standard digital multimeter (±0.03% at 200 Mv) (not shown). Optical transmission was measured on films sputtered on glass slides adjacent to the thermocouples using a Cary 14 spectrophotometer (not shown).

Figure 2:
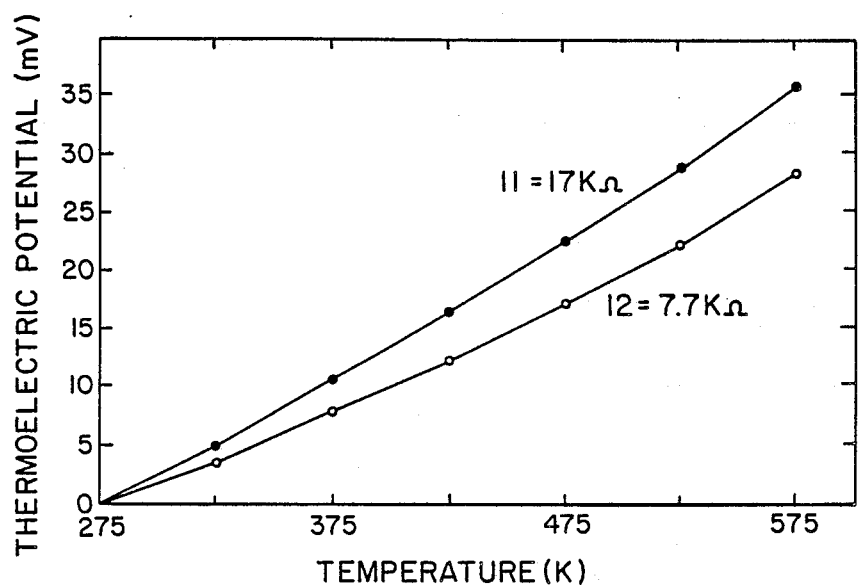
FIG. 2 is a graph of the thermoelectric response of two ITO/$In_2O_3$ thin film thermocouples with room temperature resistances of 17 K ohms and 7.7 K ohms.

The responses of the ITO/In$_2$O$_3$ thin film thermocouples are given in FIG. 2. Thermocouple 11 was 1.0 μm thick and had an electrical resistance of 17 K ohms as deposited, measured at room temperature. Thermocouple 12 was 1.0 μm thick and had an electrical resistance of 7.7 K ohms, as deposited, measured at room temperature. Both ITO legs had resistivities of $2-3 \times 10^{-4}$ ohms cm. The optical transmission of the thin films 11 and 12 ranged from 80% at 450 nm to 94% at 700 nm for the ITO and 68%–83% for the In$_2$O$_3$. Thermocouple 12 was also coated with a reactively sputtered layer of Al$_2$O$_3$ approximately 0.9 μm thick to improve its stability in air at high temperatures. The output of this transparent thermocouple remained stable within 2% for 10 hours at 575 K.

Figure 3:
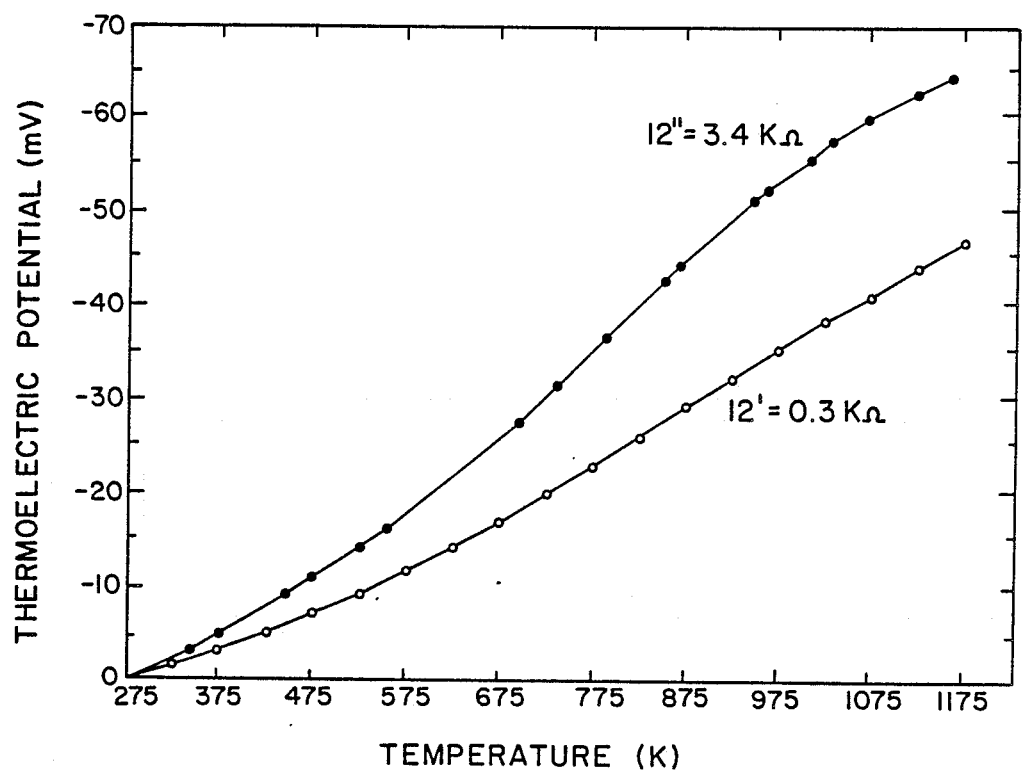
FIG. 3 is a graph of two ITO/Pt thin film thermocouples with room temperature resistance of 0.3 K ohms.
Figure 4:
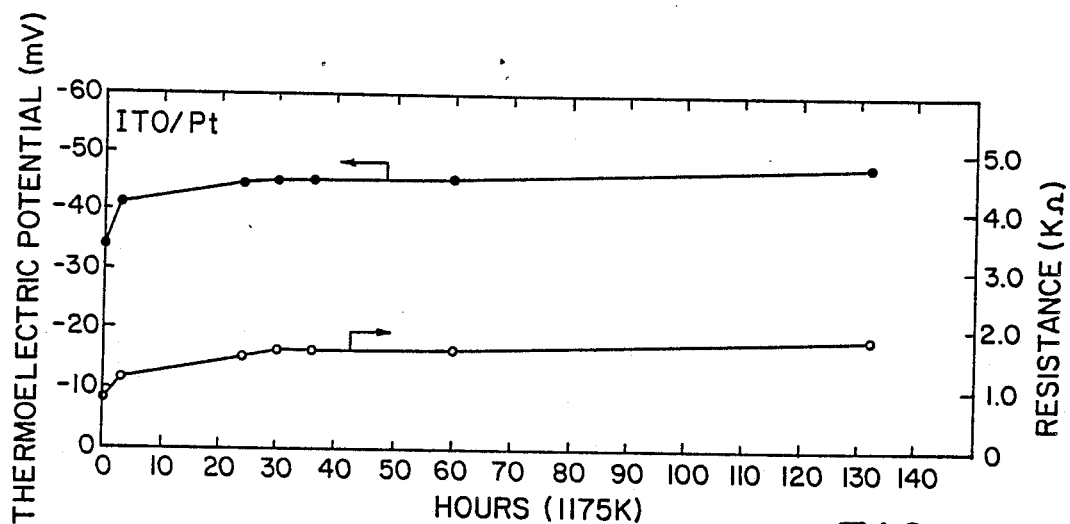
FIG. 4 is a graph of thermoelectric potential and resistance of an ITO/Pt thin film thermocouple after exposure at 1175 K in air.

In order to determine the thermoelectric potential (TEP) of the sputtered ITO film, thermocouples were produced with ITO and platinum legs. Two calibration curves for these sputtered thin film thermocouples are shown in FIG. 3. Thermocouple 12' (0.9 μm Pt and 1.0 μm ITO) (not shown) was produced under standard conditions (40% O$_2$, 600 K) for ITO which yields low resisistivity films ($2-3 \times 10^{-4}$ ohm cm) and a resistance of 0.3 K ohms as deposited measured at room temperature. Thermocouple 12'' (1.9 μm Pt, 0.6 μm ITO) (not shown) was produced under higher oxygen partial pressures leading to higher resistivity ($3 \times 10^{-3}$ ohm cm) and resistance of 3.4 K ohms as deposited, measured at room temperature. These thin films of ITO/Pt have a very high TEP at very high temperatures (45–63 mv at 1175 K). TC-C was also tested for stability at 1175 K for 132 hours. FIG. 4 contains the results of those tests indicating excellent stability after an initial aging at temperature. These tests included four cycles between room temperature and 1175 K.

Figure 5:
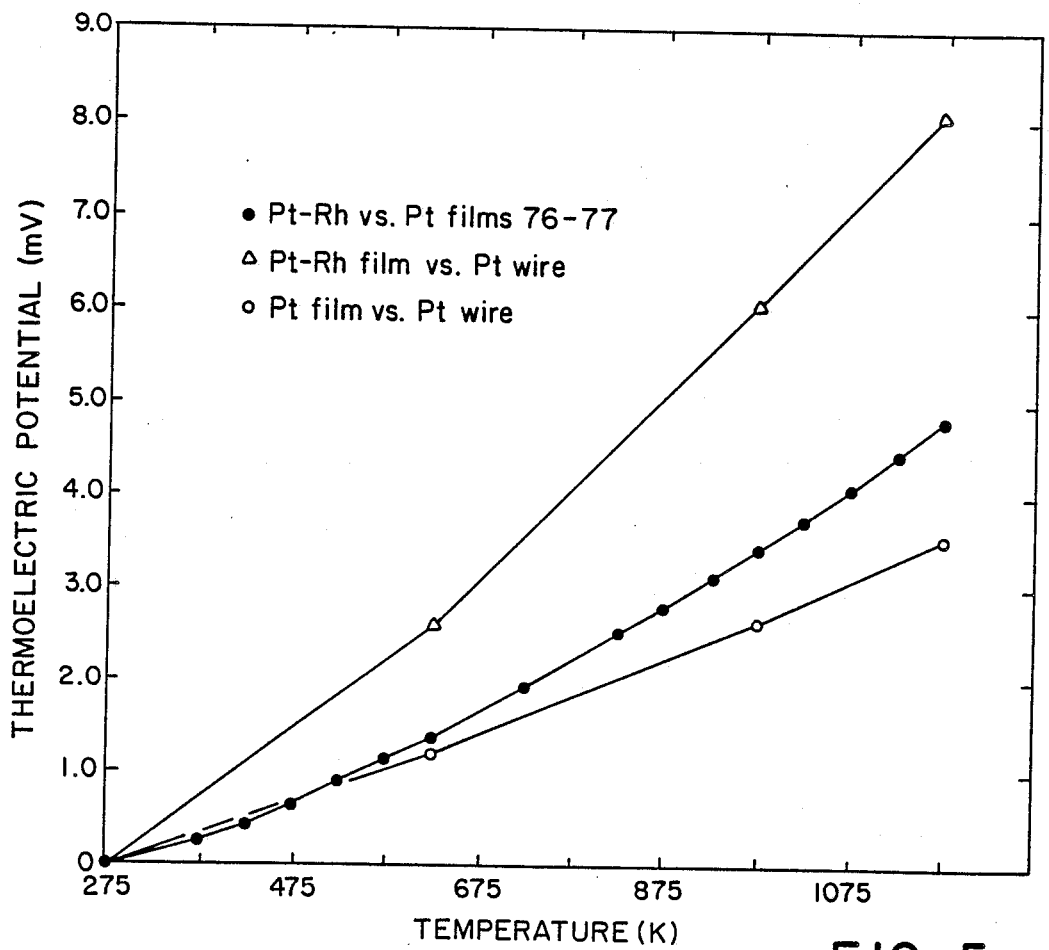
FIG. 5 is a graph showing thermoelectric potential of platinum and platinum 10% rhodium thin film thermocouple legs compared to reference grade platinum wire.

Thin film thermocouples do not necessarily have the thermoelectric potential of bulk materials as reported by prior researchers. They related the output of iron-constantin and type K thin film thermocouples to film thickness and defect concentration. The vapor deposited thin film thermocouples in those systems was reported to be approximately 60 % of bulk values. They also reported that vapor deposited Mo-Ni thin films had outputs dependent primarily on deposition rate, and substrate temperature. They were able to relate the thermoelectric output to film resistivity. The output of the platinum thin films in this invention were not found to be equal to that of bulk or wire platinum. Therefore, the platinum thin films were calibrated with reference grade thermocouple wires welded to the hot end of the thin film. For this test, a full thin film thermocouple was deposited as shown in FIG. 1 with the reference platinum 75 μm wires 13 welded to each leg. The platinum leg was 2.2 μm thick and the platinum rhodium leg was 1.6 μm thick. The results of these tests are shown in FIG. 5. The thermoelectric output of the platinum 10% rhodium thin film compared to the platinum wire is within 4% of the expected value for bulk materials at 1175 K, however, the platinum film is generating 3.5 mV at 1175 K compared to the bulk platinum values. Other platinum thin films 5 and 15 μm thick from the same target yielded 4.01 and 4.44 mV, respectively, thermoelectric potential at 1175 K. In order to determine the cause of the positive thermoelectric power compared to bulk platinum, the compositions of the bulk thin films were measured by energy dispersive x-ray spectroscopy (EDX) and the film resistivity was approximately three times the bulk value ($3 \times 10^{-5}$ versus $1.1 \times 10^{-5}$ ohm cm) for platinum films of 2, 5, and 15 μm thickness. The composition of these films as measured by EDX included some rhodium contamination (approximately 0.5%), less than 0.2% argon, and less than 0.2% of any other metallic impurity.

Normally a positive increase in the thermoelectric power of platinum would indicate a solute atom which caused a decrease in the electron concentration. Since the metallic impurities are low in the platinum and the long exposure to air at 1175 K should equilibrate O$_2$ and oxidize carbon; crystalline defect concentration leading to higher resistivity may be the most important factor. This factor may also be the most important in the ITO output as observed in FIG. 4. A separate measurement of the thermoelectric potential of an electron beam deposited pure platinum film also had a positive potential 2.00 mV at 1175 K. This film (0.2 μm thick) was produced from a different source and vacuum system. Considering these results, the need for thin film thermocouple calibration is clear.

It is recognized by the inventors that other transparent oxides which are electrically conductive may also be useful in the practice of this invention; the indium-tin-oxide system was chosen and demonstrated as the most promising of these material systems. Stabilized cubic zirconia, ZrO$_2$(Y) and beta alumina, NaAlO$_2$, are also electrically conducting transparent oxides. The demonstrated thermocouple included a positive leg of In:Sn with a 9:1 weight fraction and a negative leg containing no tin, however, it can be inferred that intermediate compositions would also be useful and that a higher tin content of up to one fifth of the indium may also be useful.

While the invention has been explained with respect to a preferred embodiment thereof, it is contemplated that various changes may be made in the invention without departing from the spirit and scope thereof.

What is claimed is:

1. A method for producing a transparent thin film thermocouple on a surface comprising the steps of:
    forming a thin film element of indium tin oxide (ITO) with an In:Sn weight fraction ratio of 9:1 on said surface by reactive sputtering; and
    forming a thin film element of indium oxide (In$_2$O$_3$) or ITO with a lower tin constant than the positive leg on said surface by reactive sputtering;

said elements being electrically joined to form a hot junction for conversion of heat into electricity.

2. A method according to claim 1, in which said reactive sputtering is accomplished with a magnetron source in an argon and oxygen atmosphere and a surface temperature between 550-600 K.

3. A method according to claim 2, wherein said atmosphere comprises 10 to 40 % of oxygen.

4. A transparent thin film thermoelectric device for the conversion of heat into electricity comprising:
a surface;
a positive element comprising indium tin oxide (ITO) with an In:Sn weight fraction ratio of 9:1 formed on said surface;
a negative element comprising indium oxide ($In_2O_3$) or ITO with a lower tin content than the positive leg formed on said surface; and
said positive and negative elements being electrically joined to form a hot junction.

5. A thermoelectric device as claimed in claim 4 wherein said positive element contains 10% tin.

6. A thermoelectric device as claimed in claim 1, wherein said positive and negative elements are thin films formed by reactive sputtering.

* * * * *